(12) United States Patent
Nelson et al.

(10) Patent No.: US 11,113,182 B2
(45) Date of Patent: Sep. 7, 2021

(54) REVERSIBLE DEBUGGING IN A RUNTIME ENVIRONMENT

(71) Applicant: MICROSOFT TECHNOLOGY LICENSING, LLC, Redmond, WA (US)

(72) Inventors: Patrick Lothian Nelson, Redmond, WA (US); Jackson Michael Davis, Carnation, WA (US); Del Myers, Seattle, WA (US); Thomas Lai, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 16/372,210

(22) Filed: Apr. 1, 2019

(65) Prior Publication Data

US 2020/0310946 A1 Oct. 1, 2020

(51) Int. Cl.
*G06F 11/36* (2006.01)
*G06F 9/455* (2018.01)
*G06F 30/20* (2020.01)

(52) U.S. Cl.
CPC ...... *G06F 11/3664* (2013.01); *G06F 9/45558* (2013.01); *G06F 30/20* (2020.01); *G06F 2009/45575* (2013.01); *G06F 2009/45591* (2013.01)

(58) Field of Classification Search
CPC .............. G06F 11/3664; G06F 30/20; G06F 2009/45575
USPC .................................................. 717/120–161
See application file for complete search history.

(56) References Cited

U.S. PATENT DOCUMENTS

| 5,497,500 A | 3/1996 | Rogers et al. |
| 5,652,909 A | 7/1997 | Kodosky |
| 5,737,622 A | 4/1998 | Rogers et al. |
| 5,784,552 A | 7/1998 | Bishop et al. |
| 6,434,741 B1 | 8/2002 | Mirani et al. |

(Continued)

FOREIGN PATENT DOCUMENTS

| WO | 9838575 A1 | 9/1998 |
| WO | 0148607 A2 | 7/2001 |

OTHER PUBLICATIONS

Gottbrath, Chris. "Reverse debugging with the TotalView debugger." Cray User Group Conference. 2008.pp. 1-17 (Year: 2008).*

(Continued)

*Primary Examiner* — Satish Rampuria
(74) *Attorney, Agent, or Firm* — Workman Nydegger (57) ABSTRACT

Performing reverse execution debugging of an application. The method includes identifying a snapshot of application state for an application in an application framework. The method further includes emulating execution of the application, using bytecode, in a forward direction from the snapshot to an end point, causing generation of historical execution state at various points along the emulation of the application. The method further includes collecting the historical execution state. The method further includes using the collected historical execution state, emulating reverse execution of the application by substituting collected historical execution state, when needed, to restore previous state needed as a result of emulation of reverse execution of the application.

20 Claims, 9 Drawing Sheets

(56) References Cited

U.S. PATENT DOCUMENTS

| | | | |
|---|---|---|---|
| 7,757,129 | B2 | 7/2010 | Bohizic et al. |
| 8,352,240 | B2 | 1/2013 | Chow et al. |
| 8,539,455 | B2 | 9/2013 | Berg et al. |
| 9,122,795 | B1 | 9/2015 | Daudel et al. |
| 9,348,624 | B2 | 5/2016 | Aniszczyk et al. |
| 9,459,989 | B2 * | 10/2016 | Sasikumar .......... G06F 11/3628 |
| 9,898,385 | B1 * | 2/2018 | O'Dowd ............. G06F 11/3096 |
| 9,904,615 | B1 * | 2/2018 | O'Dowd ................. G06F 30/20 |
| 2014/0033178 | A1 * | 1/2014 | Sasikumar .......... G06F 11/3636 717/125 |
| 2015/0378870 | A1 | 12/2015 | Marron et al. |
| 2016/0292061 | A1 | 10/2016 | Marron et al. |
| 2016/0335172 | A1 * | 11/2016 | Smith ..................... G06F 11/36 |
| 2019/0065347 | A1 | 2/2019 | Mola |
| 2020/0310942 | A1 | 10/2020 | Nelson et al. |

OTHER PUBLICATIONS

Cui, Weidong, et al. "{REPT}: Reverse Debugging of Failures in Deployed Software." 13th {USENIX} Symposium on Operating Systems Design and Implementation ({OSDI} 18). 2018.pp. 17-32 (Year: 2018).*

Pan, Douglas Z., and Mark A. Linton. "Supporting reverse execution for parallel programs." Proceedings of the 1988 ACM SIGPLAN and SIGOPS workshop on Parallel and distributed debugging. 1988.pp. 124-129 (Year: 1988).*

Sosič, Rok. "History cache: hardware support for reverse execution." ACM SIGARCH Computer Architecture News 22.5 (1994): pp. 11-18. (Year: 1994).*

Akgul, Tankut, and Vincent J. Mooney III. "Assembly instruction level reverse execution for debugging." ACM Transactions on Software Engineering and Methodology (TOSEM) 13.2 (2004): pp. 149-198. (Year: 2004).*

Chen, Shyh-Kwei, W. Kent Fuchs, and Jen-Yao Chung. "Reversible debugging using program instrumentation." IEEE transactions on software engineering 27.8 (2001): pp. 715-727. (Year: 2001).*

Tolmach, Andrew P., and Andrew W. Appel. "Debugging Standard ML without reverse engineering." Proceedings of the 1990 ACM Conference on LISP and Functional Programming. 1990. pp. 1-12 (Year: 1990).*

Engblom, Jakob. "A review of reverse debugging." Proceedings of the 2012 System, Software, SoC and Silicon Debug Conference. IEEE, 2012. pp. 1-6 (Year: 2012).*

Gonzalez-Abril, Juan Jose, and German Vidal. "Causal-consistent reversible debugging: improving CauDEr." International Symposium on Practical Aspects of Declarative Languages. Springer, Cham, 2021.pp.145-160 (Year: 2021).*

"International Search Report and Written Opinion Issued in PCT Application No. PCT/US20/020582", dated Jun. 8, 2020, 13 Pages.

"International Search Report and Written Opinion Issued in PCT Application No. PCT/US20/020579", dated Jun. 25, 2020, 11 Pages.

Barr, et al. "Tardis: Affordable Time-travel Debugging in Managed Runtimes", In Proceedings of the ACM International Conference on Object Oriented Programming Systems Languages & Applications, Oct. 20, 2014, pp. 67-82.

"Non Final Office Action Issued in U.S. Appl. No. 16/372,204", dated Feb. 20, 2020, 14 Pages.

Koju, et al., "An Efficient and Generic Reversible Debugger using the Virtual Machine based Approach", In Proceedings of 1st International Conference on Virtual Execution Environments, Jun. 11, 2005, pp. 79-88.

"Non-Final Office Action Issued in U.S. Appl. No. 16/372,204", dated Nov. 9, 2020, 35 Pages.

* cited by examiner

REVERSIBLE DEBUGGING IN A RUNTIME ENVIRONMENT

BACKGROUND

Background and Relevant Art

Computers and computing systems have affected nearly every aspect of modern living. Computers are generally involved in work, recreation, healthcare, transportation, entertainment, household management, etc.

Various types of computer programming exist. One type of computer programming that has widespread acceptance is accomplished by programming applications within the context of an application framework. For example, the .NET framework available from Microsoft Corporation of Redmond Wash. is one example of a framework which can be used to create applications. When programming applications for a framework, often a programmer will generate source code. The source code is compiled to intermediate language code, or bytecode. Bytecode is executed by a runtime virtual machine (for example, a Java virtual machine or common language runtime (CLR)) on a host computer system, where the runtime virtual machine compiles the bytecode to native machine code (for example in a just in time (jit) fashion) for execution by the specific computer system on which the runtime virtual machine is running. Note that different runtime virtual machines can do this in different ways. For example, the Java virtual machine interprets bytecode, and selectively compiles to native machine code when it determines that it is advantageous to do so. .NET runtime virtual machine compiles the bytecode to machine code before executing.

Application programmers typically have needed to debug applications while developing the applications and/or as a result of problems that arise when using the applications in the field. To accomplish this, the application programmers will use a debugger, which includes a debugger virtual machine that is able to emulate execution of an application. Note that the debugger virtual machine is an emulator that emulates functionality of runtime virtual machines, and thus, is not itself a runtime virtual machine. A debugger virtual machine is a virtual machine capable of interpreting bytecode and emulating execution of that bytecode given a previous process state. It may or may not share implementation details with the runtime virtual machine. A debugger virtual machine allows the programmer to step through code to attempt to identify where problems or errors occur. In particular, a developer can step at high-level, source code, which is translated to bytecode by the source compiler and then jit compiled to machine language. In some embodiments, the debugger virtual machine allows the developer to step through all of the layers at once. The view of the bytecode is superimposed on top of the jit compiled native machine code. The view of the source language code is then super-imposed on top of that. However, the machine language code is not directly executed, but rather the debugger virtual machine emulates the execution.

Tracking down and correcting undesired software behaviors is a core activity in software development. Undesired software behaviors can include many things, such as execution crashes, runtime exceptions, slow execution performance, incorrect data results, data corruption, and the like. Undesired software behaviors might be triggered by a vast variety of factors such as data inputs, user inputs, race conditions (e.g., when accessing shared resources), etc. Given the variety of triggers, undesired software behaviors can be rare and seemingly random, and extremely difficult to reproduce. As such, it can be very time-consuming and difficult for a developer to identify a given undesired software behavior. Once an undesired software behavior has been identified, it can again be time-consuming and difficult to determine its root cause(s).

Developers have classically used a variety of approaches to identify undesired software behaviors, and to then identify the location(s) in an application's code that cause the undesired software behavior. For example, a developer might test different portions of an application's code against different inputs (e.g., unit testing). As another example, a developer might reason about execution of an application's code in a debugger (e.g., by setting breakpoints/watchpoints, by stepping through lines of code, etc. as the code executes). As another example, a developer might observe code execution behaviors (e.g., timing, coverage) in a profiler. As another example, a developer might insert diagnostic code (e.g., trace statements) into the application's code.

Traditionally, source level debuggers have only allowed execution in the forward direction. That is, a starting point will be selected, state will be loaded for the starting point, and the bytecode will either be executed on a runtime virtual machine or the application execution will be emulated using a debugger virtual machine. The state of the application can be monitored as the application is executed and/or emulated. Bytecode debugger virtual machines have typically not been able to allow reverse execution of the program. Enabling reverse execution is difficult because forward execution tends to destroy previous state. Thus, if an application is stepped back to before a bytecode instruction which changes state, previous state which was changed by the instruction has been lost and cannot be changed to the state that existed prior to the instruction.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a method of performing reverse execution debugging of an application. The method includes identifying a snapshot of application state for the application. The method further includes emulating execution of the application, using bytecode, in a forward direction from the snapshot to an end point, causing generation of historical execution state at various points along the emulation of the application. The method further includes collecting the historical execution state. The method further includes using the collected historical execution state, emulating reverse execution of the application by substituting collected historical execution state, when needed, to restore previous state needed as a result of emulation of reverse execution of the application.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

One example embodiment illustrated herein enables reversible debugging by using recorded data, including periodic (or otherwise obtained) snapshots of application execution along with a collection of runtime virtual machine external state (i.e., data that cannot be reproduced by emulating execution of the application). Embodiments may record full snapshots of an entity's memory space and processor registers while it executes. Runtime virtual machine external state may be produced at kernel calls or at other places of non-determinism. In general, any time execution leaves and reenters execution of the runtime virtual machine, runtime virtual machine external state is potentially produced. At these points in execution, runtime virtual machine external state can be recorded. Note that in some embodiments, full snapshots may be taken at points of nondeterminism, with respect to the runtime virtual machine, such that the collection of snapshots would include all runtime virtual machine external state. However, these embodiments would have substantial overhead required. Therefore, it may be preferable to take periodic snapshots that capture all relevant state along with separate recoding of individual pieces of runtime virtual machine external state, recorded at points of nondeterminism, with respect to the runtime virtual machine.

Note that as will be discussed in further detail below, embodiments may be somewhat selective in recording data. For example, some embodiments will only record data for later debugging for user generated application code. For example, while user generated application code may make various calls to various libraries and functions within the framework for the runtime virtual machine, execution of those functions is not of interest due to the fact that it represents code which the user is not actively developing. Thus, in some embodiments, snapshots and collection of runtime virtual machine external state will not be collected for portions of the runtime virtual machine code that are not user generated portions of the runtime virtual machine code. Note that some embodiments allow this to be modified. For example, a user may wish to collect snapshots and runtime virtual machine external state in code other than user generated code. The user can indicate that additional code should have data collected for debugging. In some embodiments, collecting data for user code may be a default setting such that collection of data for other code requires the user to modify collection of data beyond the default.

Note that recorded debugging data can be used in a number of different fashions. For example, in some embodiments, a user may simply collect the debugging data as the user actively develops an application. That is, as the user is developing an application, the user can also execute portions of the application to collect debugging data for the application. The user can then use the debugging data to step through an emulated execution of the application. Alternatively or additionally, the recorded debugging data can be provided to another entity for debugging. In yet another alternative or additional embodiment, the recorded debugging data can be provided to an automated execution inspection entity configured to use the recorded debugging data to emulate execution of the application in an automated fashion to check for certain characteristics, results, or other desired information.

If the application is a process executed by a runtime virtual machine (for example .NET runtime or Java VM), it's possible to capture only the state related to the runtime virtual machine rather than the entire process. After these snapshots are created, it is possible to replay forward from the snapshot using a debugger virtual machine, which is an emulator of the runtime virtual machine (i.e., a secondary diagnostic virtual machine configured to emulate the runtime virtual machine). The emulated bytecode instructions of the debugger virtual machine are typically more simply emulated than execution of the actual native machine code executed by the framework runtime virtual machine of the host machine enabling lower overhead replay than the traditional techniques of native emulation.

Immediate state is generated and preserved as historical state by forward emulation using a debugger virtual machine from a snapshot, where the preserved historical state can be used to restore previous state that would have otherwise been unavailable. Thus, once embodiments are able to emulate forward from a snapshot, the emulation can preserve historical state necessary (i.e., previous state) to execute in reverse enabling a full fidelity reversible debugging scenario.

Embodiments can obtain and preserve collected state in various different ways. For example, in some embodiments, collecting the historical execution state is done by collecting the execution state into a stack such that the previous state can be restored by popping elements of the historical execution state from the stack as needed. Alternatively, collecting the historical execution state includes collecting the historical execution state by iteratively emulating execution, using a debugger virtual machine, from the snapshot toward an endpoint, where each iteration of emulated execution emulates execution of progressively smaller portions of the application. For example, in some embodiments an instruction count may be kept for each iteration. A successive iteration emulates execution of one less instruction. Reverse execution of the application is emulated by surfacing state as a result of each iteration.

Details are now illustrated.

Figure 1:
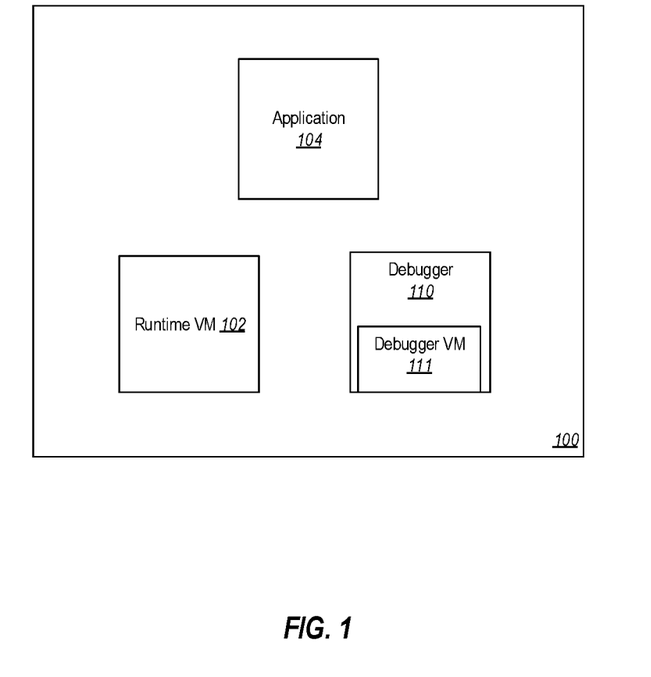
FIG. 1 illustrates a system including a runtime virtual machine virtual machine and a debugger, including a debugger virtual machine.

FIG. 1 illustrates a runtime virtual machine 102 implemented on a computer system 100. In this example, the runtime virtual machine 102 may be a common language runtime virtual machine such as those available in the .NET runtime available from Microsoft Corporation of Redmond Wash. or a Java virtual machine. These runtimes virtual machines manage the execution of managed code, such as .NET applications. An example of an application 104 is illustrated. The runtime virtual machine 102 executes bytecode on a real machine (i.e., the computer system 100). This is done by either interpreting the bytecode within the runtime virtual machine 102, or compiling and executing it for the specific machine on which the runtime virtual machine 102 is executing. Thus, the application 104 has a bytecode representation. Typically, bytecode is created by compiling source code to bytecode.

The runtime virtual machine 102 can convert compiled bytecode into native machine instructions which can then be executed as appropriate by the computer system 100. For example, in some embodiments, the runtime virtual machine 102 can perform jit compilation to convert the bytecode of the application 104 to machine instructions for execution on a processor of the computer system 100.

Figure 2:
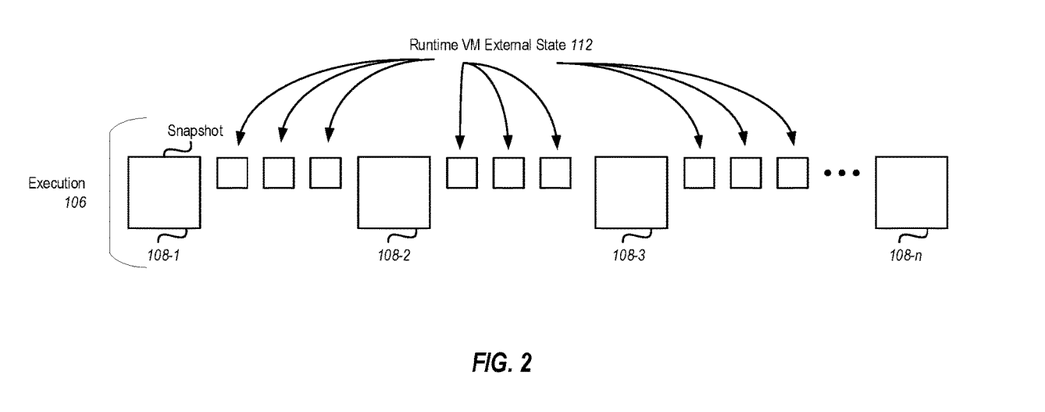
FIG. 2 illustrates execution of an application in a runtime virtual machine.

Referring now to FIG. 2, an example execution 106 of the application 104 is illustrated. In the example execution, bytecode instructions from the application 104 are converted to native machine instructions which are executed by the computer system 100. As the native machine instructions are executed, the state of the runtime virtual machine 102 will change. In some embodiments, snapshots (illustrated in the present example at 108-1, 108-2, 108-3, through 108-n) are taken. In some embodiments, these snapshots may be taken on a periodic basis. Alternatively or additionally, the snapshots may be taken based on breakpoints set in machine instructions. For example, a developer can identify locations in the application 104 where breakpoints should occur. The appropriate machine instructions can be identified, and breakpoints can occur at these locations to generate a snapshot of the runtime virtual machine 102, where after execution of the application can be resumed. Alternatively or additionally, snapshots may be taken at points where execution leaves and/or returns to the runtime virtual machine.

During the execution 106 of the application 104 there may be various points during the execution where runtime virtual machine external state (i.e., state that cannot be recreated by emulation of the application) is generated. This runtime virtual machine external state will be needed later when attempting to debug the application 104. That is, embodiments may need to collect runtime virtual machine external state when executing an application, when the application will be later emulated, because that state will not be available during emulation. Namely, that runtime virtual machine external state is generated during execution only and cannot be sufficiently emulated by a debugger.

Runtime virtual machine external state (which as used herein is any nondeterministic state from the perspective of the runtime virtual machine, and includes external state that cannot be recreated by virtually re-executing the application during replay) can be generated as a result of a number of different actions. For example, kernel calls may result in the generation of runtime virtual machine external state. When execution of the application 104 enters or exits the runtime virtual machine, runtime virtual machine external state may be generated. Calls to an API may generate runtime virtual machine external state. Instructions generating a random number may result in runtime virtual machine external state. Instructions identifying a date, time, etc. may result in generation of runtime virtual machine external state. Reading or writing file I/O may result in the generation of runtime virtual machine external state. Shared memory reads may result in the generation of runtime virtual machine external state. Multithreading can result in the generation of runtime virtual machine external state.

Thus, the debugger 110 is configured to periodically (or use other criteria) capture the snapshots 108-1, and the runtime virtual machine external state, generally illustrated at 112, as a result of identifying some instruction, event, etc. that results in the generation of runtime virtual machine external state. The snapshots, referred to generally as snapshots 108, and runtime virtual machine external state 112 can be preserved for later use in emulation of the application 104. Additionally, as will be illustrated below, emulation of the application 104 can be used to generate historical state. Historical state is typically generated by managed code elements of the application 104 and this can be collected by emulation of the application 104 without the need to actually execute the application 104. That is, a debugger 110, implemented with a debugger virtual machine 111 can emulate the runtime virtual machine 102 and execution of the application 104 without actually needing to perform a full execution requiring compilation of the application 104 to native machine instructions. Note that the debugger virtual machine 111 is capable of interpreting bytecode and emulating execution of that bytecode given a previous process state. It may or may not share implementation details with the runtime virtual machine 102. As will be illustrated later, this collected historical state can then be used to emulate reverse execution of the application 104.

Figure 3:
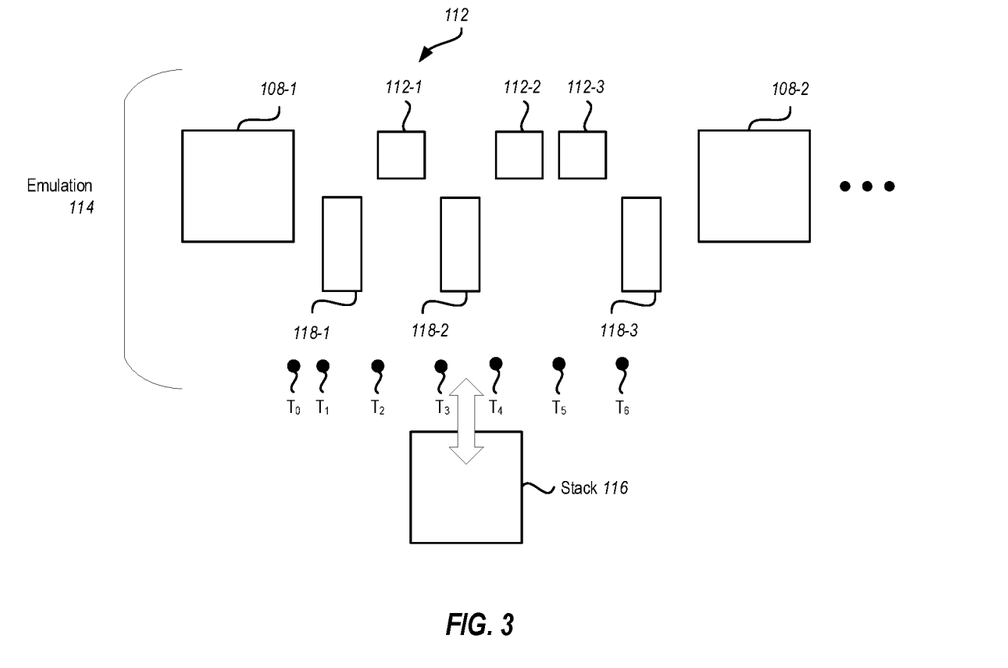
FIG. 3 illustrates emulation of the application.

Referring now to FIG. 3, one example of emulating forward and reverse execution of the application 104 is illustrated. FIG. 3 illustrates the emulation 114. To perform emulation 114, the debugger 110 may emulate execution using the debugger virtual machine 111. Note that emulation does not necessarily require the application 104 to have its bytecode compiled to native machine language as the debugger virtual machine 111, so long as it has available data in the snapshots 108 and the runtime virtual machine external state 112, can accurately emulate execution of the application without needing to execute machine level instructions. In the example illustrated, assume that a developer wishes to emulate execution of the application 104 between the snapshot 108-1 and 108-2. Note that while in this example emulation is illustrated between two snapshots, emulation can be performed between a snapshot and any other ending point selected by the developer. The ending point does not necessarily need to be a snapshot, but could be any point selected by the developer using the debugger 110.

In the illustrated example, the debugger virtual machine 111 will load the state from the snapshot 108-1 to begin emulation of execution of the application 104. The debugger virtual machine 111 then begins to step through the bytecode of the application 104. As the debugger virtual machine 111 steps through the bytecode of the application 104, when runtime virtual machine external state 112 is needed, that state can be applied to the state of the debugger virtual machine 111 as appropriate.

When emulation 114 is performed in the forward direction, any changes in state are added to the stack 116.

Figure 4:
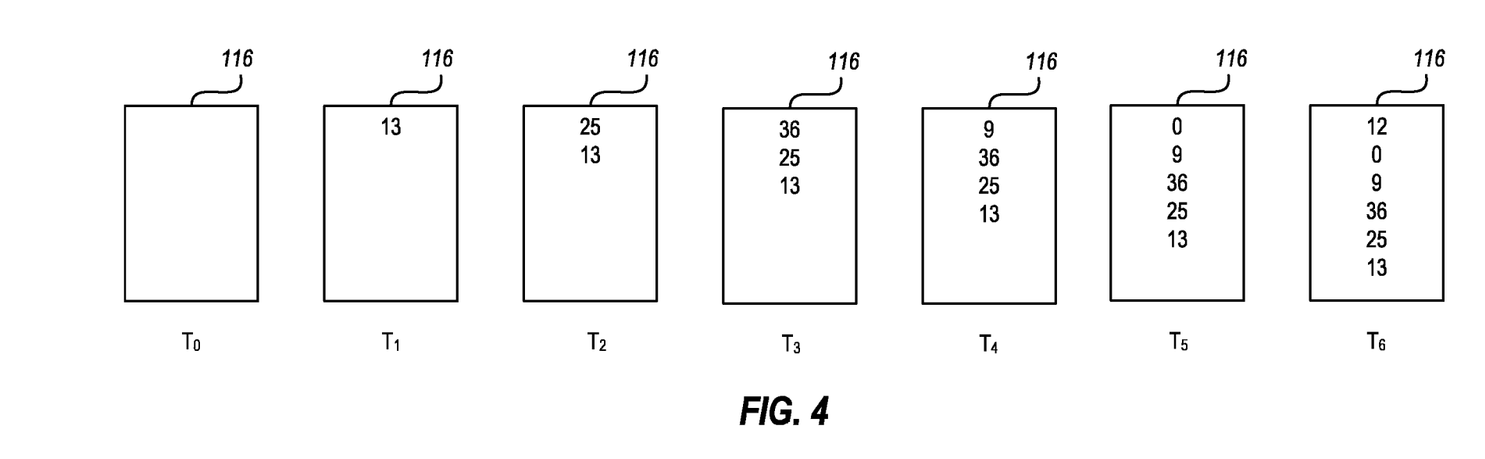
FIG. 4 illustrates the state of a stack used for debugging in forward and reverse directions when emulating an application.

Referring now to FIG. 4 various states of the stack 116 are illustrated at different times during the emulation 114. At time T0, the stack 116 is empty. At time T1, an instruction 118-1 (FIG. 3) from the application 104 changes some state value from the value 13 to some other value. Thus, the value 13 is pushed on to the stack 116 as illustrated at time T1. At time T2 runtime virtual machine external state 112-1 (FIG. 3) is changed from 25 to some new value. Thus, the value 25 is pushed to the stack as illustrated at time T2. At time T3, the instruction 118-2 (FIG. 3) changes some state value from 36 to some other value. Therefore, the value 36 is pushed to the stack 116 as illustrated at time T3. At time T4, virtual machine external state 112-2 (FIG. 3) is changed from 9 to some other value. Therefore, the value of 9 is pushed to the stack 116 as illustrated at T4. At time T5, virtual machine external state 112-3 (FIG. 3) is changed from 0 to some other value. Therefore, 0 is pushed to the stack 116. At time T6, the instruction 118-3 (FIG. 3) changes some state value from 12 to some other value. Therefore, the value 12 is pushed to the stack 116. The stack 116 subsequent to the time T6 contains all of the values of state that were previously destroyed by emulating execution of instructions that change state as well as when runtime virtual machine external state was changed.

The emulation 114 can now reverse emulation and can restore previous state. For example, if reverse emulation is begun at some point after T6, when the reverse emulation reaches the instruction 118-3 it will pop the value 12 from the stack 116 to restore the state that was changed by the instruction 118-3. Continuing further in the reverse emulation example, operations creating the runtime virtual machine external state 112-3 can be identified, and the next value, in this case 0, is popped from the stack to restore the virtual machine external state that existed prior to the virtual machine external state 112-3 to the value of 0. Reverse emulation can continue in this fashion back to the snapshot 108-1. At any point in the reverse emulation, the debugger 110 can be used examine the debugger virtual machine 111 state for debugging purposes.

A more detailed version of the example previously illustrated is now illustrated.

Figure 5:
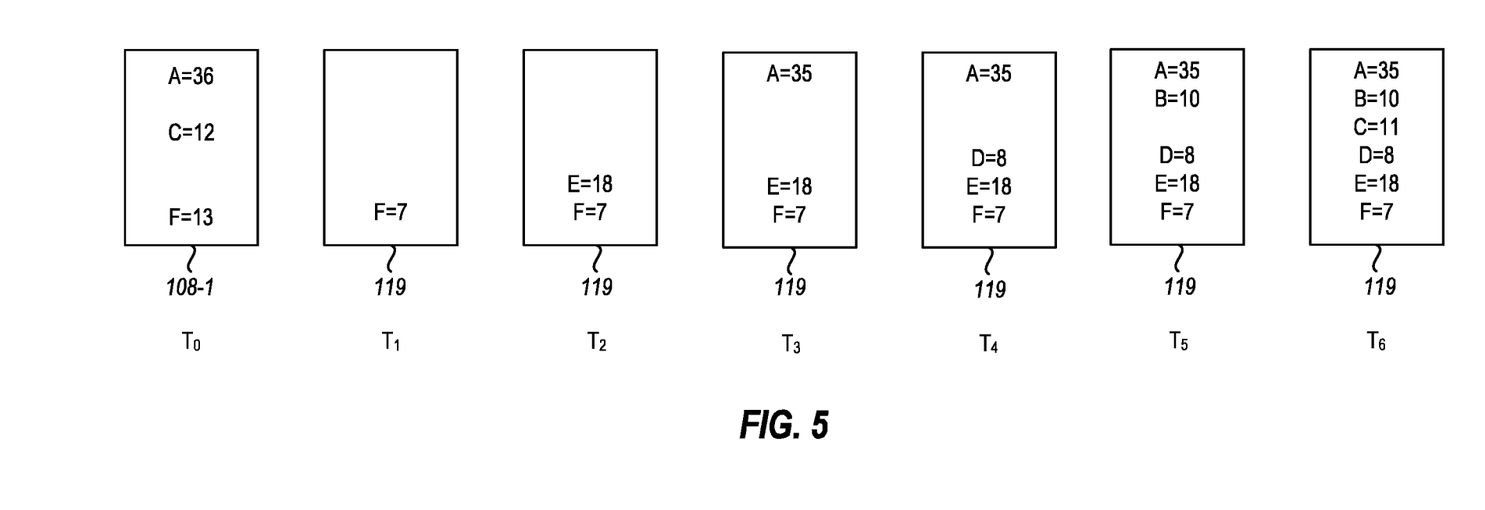
FIG. 5 illustrates the use of a snapshot and slots to maintain application state.

FIG. 5 illustrates that at T0, the snapshot 108-1 includes virtual machine state, or heap state including state indicating that A=36, C=12, and F=13. At time 1, the instruction 118-1 is emulated changing the value of F from 13 to 7. As such, as illustrated in FIG. 4, 13 is pushed onto the stack 116 at time T1. Some embodiments may include a slot which stores the differences between state in the snapshot 108-1 and the current state of the debugger virtual machine 111. Therefore, the value of F is changed at time T1 to 7 in the slot 119. At time T2, runtime virtual machine external state 112-1 is changed from a value of E=25 to E=18. As such, the value of the E=18 is added to the slot 119 at time T2 while the value of 25 is pushed to the stack 116. Processing continues as illustrated previously pushing values to the stack 116 and changing values in the slot 119. Reverse emulation can be performed as described previously, by popping values from the stack 116. As reverse emulation is performed, values will also be replaced in the slot 119. For example when the application steps back in reverse to before the instruction 118-3, the value in the slot 119 C=11 will be changed to the value C=12 to reflect the current state of C as a result of popping 12 from the stack 116 and restoring the state of C to the value that existed just prior to the instruction 118-3 being emulated.

Figure 6:
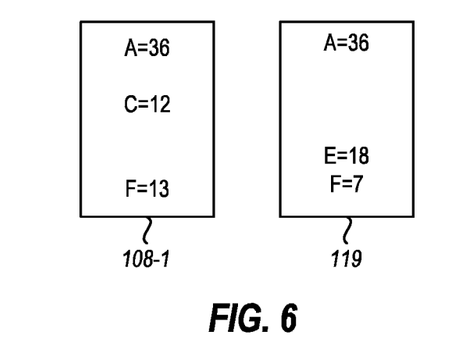
FIG. 6 illustrates the state of a snapshot and a slot at a particular point in time.

As noted above, the state of the debugger virtual machine 111 can be discovered at any time by reference to the slot 119, the appropriate indeterminate state, and/or the snapshot 108-1. For example, consider a case where forward execution has proceeded until just after time T3. Reverse execution may have been performed until just prior to time T3. At that time, the snapshot would appear as shown in FIG. 6, and the slot 119 would also appear as shown in FIG. 6. When evaluating the state of the debugger virtual machine 111, values in the slot take priority over values in the snapshot 108-1. Thus, the state of the debugger virtual machine 111 would have values of A=36, C=12, E=18, and F=7. In particular, forward emulation of the application would result in the slot 119 illustrated at T3 in FIG. 5. As illustrated in FIG. 4, the value 36 would have been pushed to the stack 116 by the instruction 118-2. Stepping back before the instruction 118-2 would cause the value of 36 to be popped from the stack 116 into the value A. The slot 119 would be updated to reflect this change in state in the value of A. In this fashion, a programmer could examine the state of the debugger virtual machine 111 using the snapshot 108-1 and the slot 119.

Another alternative example is now illustrated where collecting the historical execution state includes collecting the historical execution state by iteratively emulating execution from the snapshot toward the endpoint, where each iteration of emulated execution emulates execution of progressively smaller portions of the application, such that reverse execution of the application is emulated by surfacing state as a result of each iteration.

Figure 7:
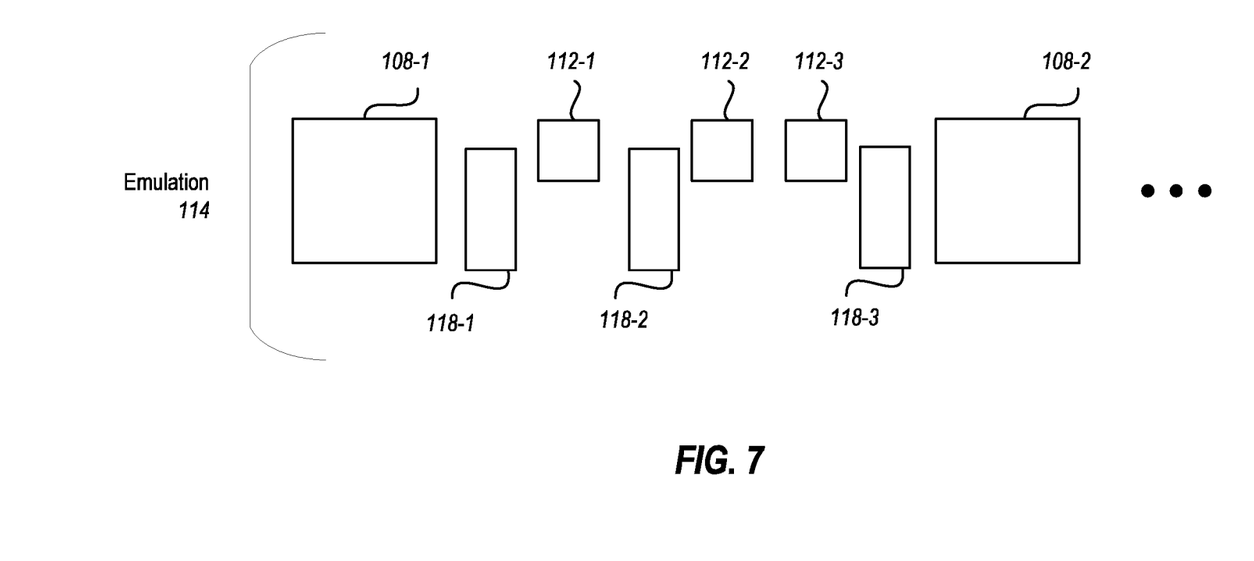
FIG. 7 illustrates another example of emulating an application.
Figure 8:
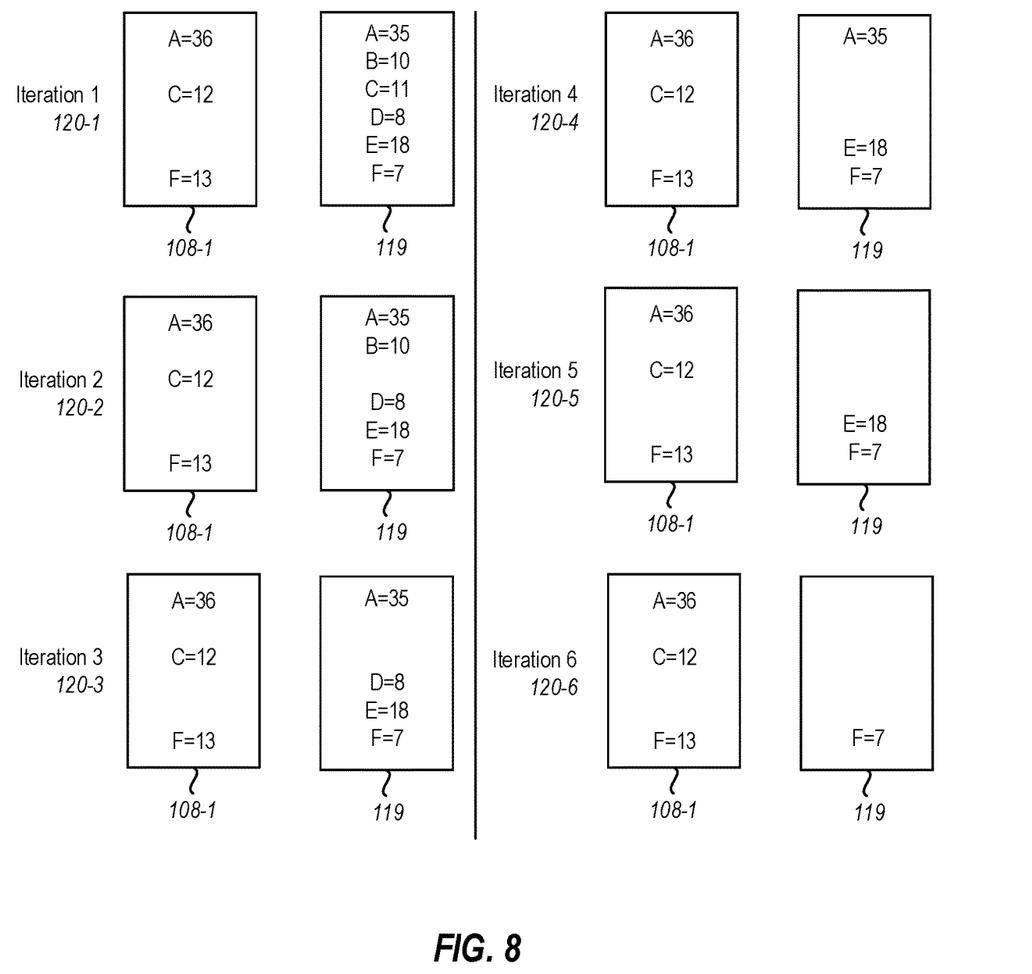
FIG. 8 illustrates slot and snapshot state using multiple iterations to simulate reverse execution of an application.

In particular, this embodiment does not need the stack 116, but rather performs iterative operations in emulating smaller portions of the application to emulate reverse execution of the application 104. Again, as illustrated in FIG. 7, in this example emulation 114 by the debugger virtual machine 111 proceeds from the snapshot 108-1 past the instruction 118-3 (FIG. 3). In the example illustrated using FIG. 8, emulation from after the instruction 118-3 in a reverse fashion back to the snapshot 108-1 is illustrated. As illustrated in FIG. 8, forward emulation is performed in a first iteration 120-1 from the snapshot 108-1 until past the instruction 108-3 (FIG. 2). This results in the state of the debugger virtual machine 111 being such that the value of A=35, B=10, C=11, D=8, E=18, and F=7. As in the previous example, these changes to state caused by emulating the emulation 114 can be preserved in a slot 119, although in other embodiments inspection of debugger virtual machine 111 state can occur in other fashions. To simulate a reverse execution emulation step, a second iteration 120-2 can be performed by performing a forward emulation from the snapshot 108-1 to a point before the instruction 118-3. In some embodiments, an instruction count may be maintained for each iteration. Each subsequent iteration may emulate one less instruction than the previous iteration.

Continuing with the example, to simulate yet another reverse emulation step, an iteration 3 120-3 can be performed by emulating in a forward direction up to the runtime virtual machine external state 112-2 (FIG. 3). To simulate yet another reverse emulation step, the fourth iteration 120-4 can be performed by emulating in a forward direction up to, and including the instruction 118-2 (FIG. 3). To simulate yet another reverse emulation step, the fifth iteration 120-5 can be performed by performing a forward emulation from the snapshot 108-1 up to and including the change to the runtime virtual machine external state 112-1 (FIG. 3). To simulate yet another reverse emulation step, the sixth iteration 120-6 can be performed by performing a forward emulation from the snapshot 108-1 up to and including the instruction 118-1 (FIG. 3).

In this way, a code developer can cause a debugger to emulate reverse execution of the application 104 by performing an appropriate number, and appropriate selection of iterations. For example, if the developer wanted to perform reverse emulation from the instruction 118-2 to the before the instruction 118-1, then the developer could cause the emulator to perform iterations 4 120-4, 5 120-5, and 6 120-6, in that order. The developer could inspect state of the debugger virtual machine 111 over time resulting from these iterative forward emulations to implement a de facto reverse emulation of the application 104.

Figure 9:
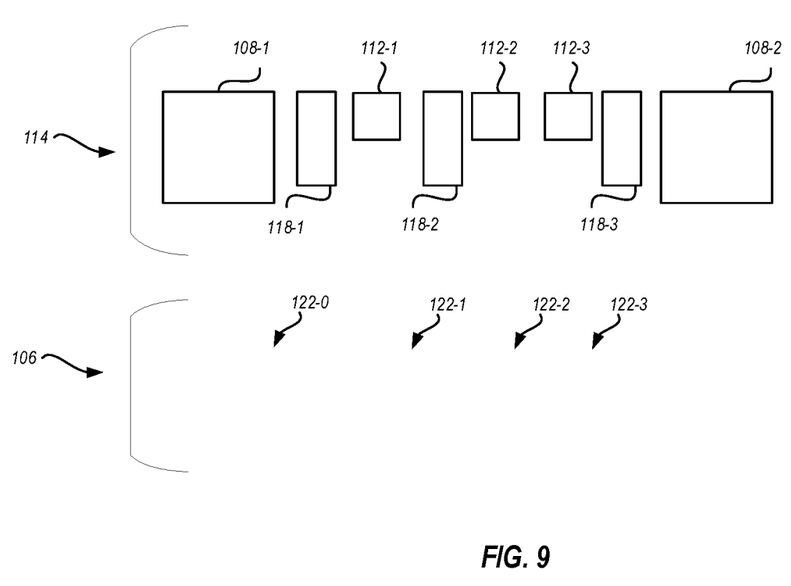
FIG. 9 illustrates collecting runtime virtual machine external state during a real time debugging process.

Note that in some embodiments, recording of runtime virtual machine external state and snapshot data by executing an application can be accomplished together with emulating the application. For example, some embodiments may be able to accomplish live debugging of an application. An example of this is illustrated in FIG. 9 which illustrates the emulation 114 performed in conjunction with the execution 106. In particular, emulation of bytecode instructions on a debugger virtual machine 111 is performed as illustrated at 114, while execution of machine level instructions is performed on a runtime virtual machine 102 as illustrated at 106 when needed. For example, when the emulation 114 proceeds to a point where the snapshot 108-1 needs to be generated, the emulator can set a breakpoint 122-0 in the execution 106 to gather runtime virtual machine state for the snapshot 108-1. The emulation can then proceed up until runtime virtual machine external state 112-1 is needed. At this point, the emulation knows that it cannot obtain the runtime virtual machine external state 112-1 on its own and needs the application to be executed by the runtime virtual machine 102. Thus, the emulator can set the breakpoint 122-1 and cause execution of the application on the runtime virtual machine 102 up until the breakpoint 122-1. At this point, the emulator can obtain the runtime virtual machine external state 112-1, and continue emulation using the debugger virtual machine 111. The emulation can continue until it is determined that the runtime virtual machine external state 112-2 is needed. Again, the emulator can set a breakpoint 122-2, and cause the execution 106 on the runtime virtual machine 102 to continue up to that point. At this point, execution of the application breaks and the emulator can obtain the runtime virtual machine external state 112-2. Again, emulation 114 can continue, using the debugger virtual machine 111, until the emulator determines that it needs the runtime virtual machine external state 112-3. The emulator can set a breakpoint 122-3 in the execution 106 and cause the execution 106 to proceed on the runtime virtual machine 102. Execution of the application breaks at the breakpoint 122-3, at which point the emulator can recover the runtime virtual machine external state 112-3.

Reverse execution can proceed in the fashions described above such that either a stack or multiple iterations of emulation can be performed as illustrated previously. Note that, in particular, only a single execution needs to be performed even though multiple iterations of the emulation 114 are performed. In particular, the runtime virtual machine external state 112-1, 112-2, and 112-3 can be preserved with a single execution 106 rather than multiple executions of the application.

Note that in some embodiments, multiple traces can be collected then debugged in one session. For example, embodiments can switch between divergent branches of execution and explore them independently.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 10:
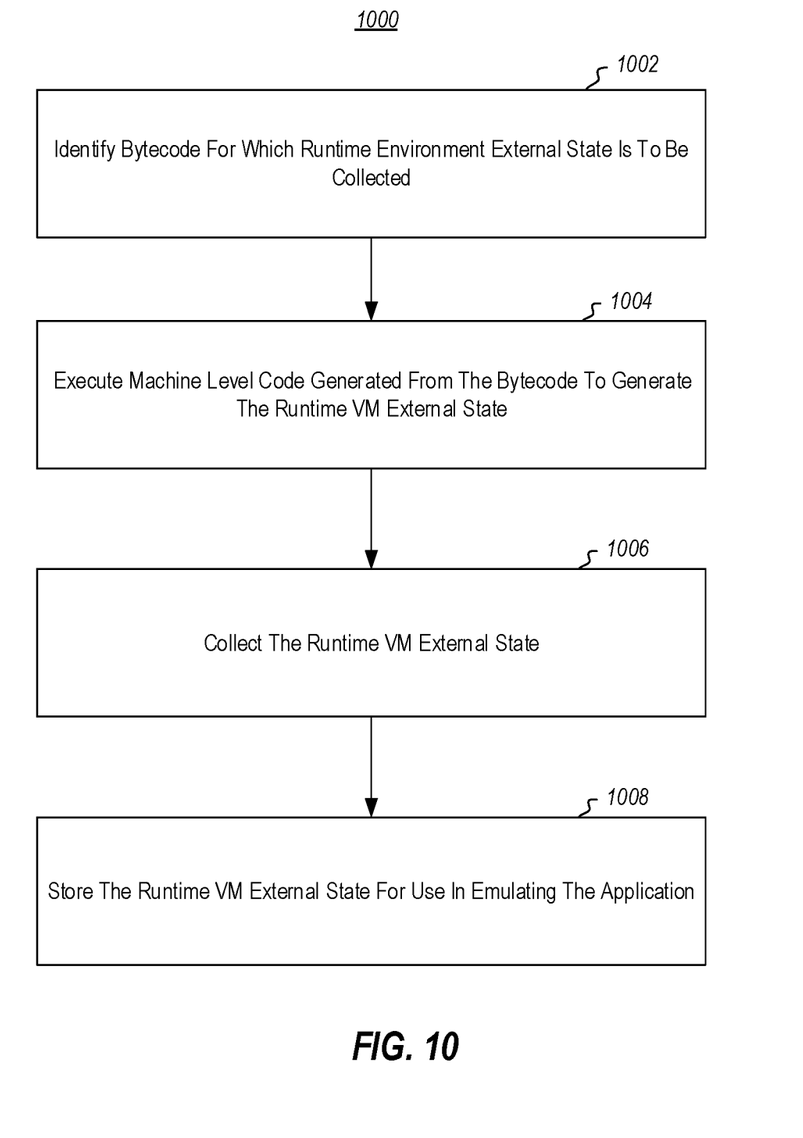
FIG. 10 illustrates a method of collecting runtime virtual machine external state for an application runtime virtual machine.

Referring now to FIG. 10, a method 1000 is illustrated.

The method 1000 includes acts for collecting runtime virtual machine external state for an application running in an application runtime virtual machine, for use in emulation of the application. The method 1000 includes identifying application bytecode for which runtime virtual machine external state is to be collected (act 1002).

The method 1000 further includes executing machine code generated from the bytecode to generate the runtime virtual machine external state (act 1004). For example, this may include compiling the bytecode to machine code, such as jit compiling bytecode to native machine code as needed to gather the runtime virtual machine external state.

The method 1000 further includes collecting the runtime virtual machine external state (act 1006).

The method 1000 further includes storing the runtime virtual machine external state for use in emulating the application (act 1008). For the example, the runtime virtual machine external state may be collected and stored persistently into a database, flat file, or other appropriate data structure.

The method 1000 may be practiced where identifying bytecode for which state is to be collected comprises identifying runtime virtual machine boundaries in execution of the application, and collecting application state between those runtime virtual machine boundaries. That is, runtime virtual machine external state, in some embodiments, will only be identified and collected for managed runtime virtual machine code.

The method 1000 may be practiced where identifying bytecode for which state is to be collected comprises identifying user generated code boundaries in execution of the application, and collecting application state between those user generated code boundaries. That is, runtime virtual machine external state, in some embodiments, will only be identified and collected for managed runtime virtual machine code created by a particular user. Other code that exists as part of the runtime virtual machine, even though it is managed code, will not have state collected, in these embodiments. This may be done, for example, when there is a desire to debug user code for a particular user. In this way, code that is not user code, which will not be debugged, does not have state collected to avoid collecting additional data that is unlikely to be used or needed for debugging.

The method 1000 may be practiced where identifying bytecode for which state is to be collected comprises identifying user identified code. For example, a user could select code using selection user interface elements such as checkboxes, highlighting, or inline instrumentation.

The method 1000 may be practiced where emulation of the application is performed in conjunction with executing the application to collect the runtime virtual machine external state. This may be done to allow for live debugging. An example of this is illustrated above in conjunction with the description of FIG. 9. In some such embodiments, an emulator used for emulating the application sets breakpoints in the machine code when the emulator identifies locations in the bytecode where runtime virtual machine external state is required. This causes a break in executing the machine code for collecting the runtime virtual machine external state.

In some such embodiments, an emulator identifies locations in the bytecode where runtime virtual machine external state is required by identifying code that performs at least one of: obtaining a random number, obtaining a time, obtaining data from another source external to runtime virtual machine code in the application runtime virtual machine, identifying shared memory reads, or identifying points where multithreading occurs.

Figure 11:
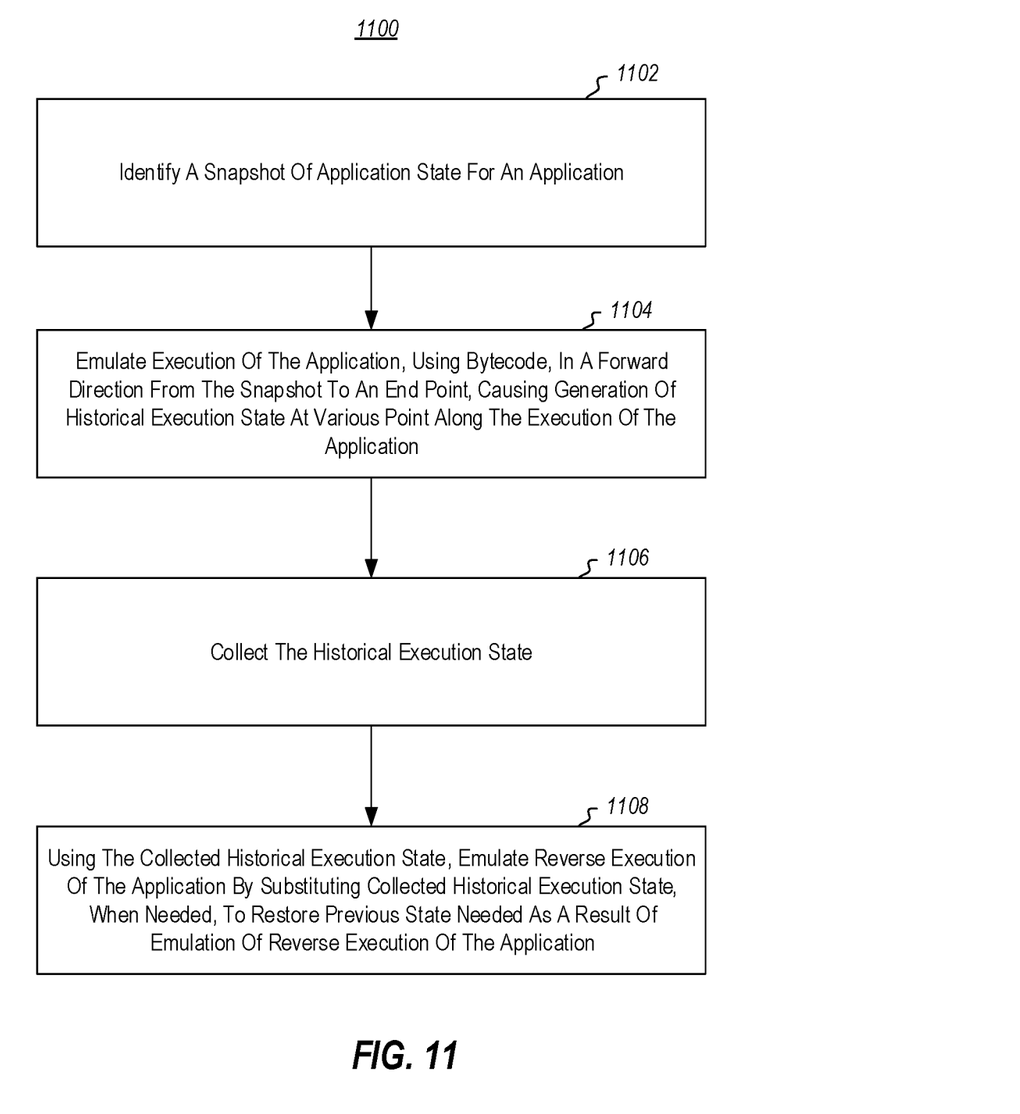
FIG. 11 illustrates a method of performing reverse execution debugging of an application.

Referring now to FIG. 11, a method 1100 is illustrated. The method 1100 includes acts for performing reverse execution debugging of an application. The method includes identifying a snapshot of application state for the application (act 1102).

The method 1100 further includes emulating execution of the application, using bytecode, in a forward direction from the snapshot to an end point, causing generation of historical execution state at various points along the emulation of the application (act 1104).

The method 1100 further includes collecting the historical execution state (act 1106).

The method 1100 further includes using the collected historical execution state, emulating reverse execution of the application by substituting collected historical execution state, when needed, to restore previous state needed as a result of emulation of reverse execution of the application (act 1108).

The method 1100 may be practiced where collecting the historical execution state comprises collecting the historical execution state into a stack such that the previous state can be restored by popping elements of the historical execution state from the stack. An example of this is illustrated in FIG. 3. In such embodiments, where multiple threads are being executed, a stack may be implemented for each thread being emulated.

In embodiments using a stack, the method 1100 may be performed where an element is popped from the stack when emulated reverse execution identifies an instruction that changes application state. This causes historical state to replace state of the application to restore the application state to the historical state.

The method 1100 may be practiced where collecting the historical execution state comprises collecting the historical execution state by iteratively emulating execution from the snapshot toward the endpoint, where each iteration of emulated execution emulates execution of progressively smaller portions of the application, such that reverse execution of the application is emulated by surfacing state as a result of each iteration. An example of this is illustrated in FIG. 8 and the accompanying description. In some such embodiments, each iteration emulates execution of one less bytecode instruction than the previous iteration.

The method 1100 may further include collecting runtime virtual machine external state for the application by executing machine application code for the application in conjunction with emulating execution of the application. An example of this is illustrated in FIG. 9, where real time debugging can be accomplished.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of performing reverse execution debugging of an application, the method comprising:
    identifying a snapshot of application state for the application;
    emulating execution of the application on a debugger virtual machine that emulates functionality of a runtime virtual machine, wherein the debugger virtual machines uses intermediate level code to emulate execution of the application on the runtime virtual machine such that at least a portion of the intermediate level code is not converted to native machine instructions and executed on the runtime virtual machine, in a forward direction from the snapshot to an end point, causing generation of emulated historical execution state at various points along the emulation of the application;
    collecting the emulated historical execution state; and
    using the collected emulated historical execution state, emulating reverse execution of the application by substituting the collected emulated historical execution state, when needed, to restore previous state needed as a result of emulation of reverse execution of the application.

2. The method of claim 1, wherein collecting the emulated historical execution state comprises collecting the emulated historical execution state into a stack such that the previous state is restored by popping elements of the emulated historical execution state from the stack.

3. The method of claim 2, wherein there is a different stack for each thread being emulated.

4. The method of claim 2, wherein an element is popped from the stack when emulated reverse execution identifies an instruction that changes application state to restore the application state to state that was valid immediately prior to the identified instruction.

5. The method of claim 1, wherein collecting the emulated historical execution state comprises collecting the emulated historical execution state by iteratively emulating execution from the snapshot toward the endpoint, where each iteration of emulated execution emulates execution of progressively smaller portions of the application, such that reverse execution of the application is emulated by surfacing state as a result of each iteration.

6. The method of claim 5, wherein each iteration executes one less bytecode instruction than the previous iteration.

7. The method of claim 1, further comprising collecting runtime virtual machine external state for the application by executing machine code for the application in conjunction with emulating execution of the application.

8. A computer system comprising:
    one or more processors; and
    one or more computer-readable media having stored thereon instructions that are executable by the one or more processors to configure the computer system to perform reverse execution debugging of an application, including instructions that are executable to configure the computer system to perform at least the following:
        identify a snapshot of application state for the application;
        emulate execution of the application on an debugger virtual machine that emulates functionality of a runtime virtual machine, wherein the debugger virtual machines uses intermediate level code to emulate execution of the application on the runtime virtual machine such that at least a portion of the intermediate level code is not converted to native machine instructions and executed on the runtime virtual machine, in a forward direction from the snapshot to an end point, causing generation of emulated historical execution state at various points along the emulation of the application;
        collect the emulated historical execution state; and
        use the collected emulated historical execution state, emulating reverse execution of the application by substituting the collected emulated historical execution state, when needed, to restore previous state needed as a result of emulation of reverse execution of the application.

9. The computer system of claim 8, wherein collecting the emulated historical execution state comprises collecting the emulated historical execution state into a stack such that the previous state can be restored by popping elements of the historical execution state from the stack.

10. The computer system of claim 9, wherein there is a different stack for each thread being emulated.

11. The computer system of claim 9, wherein an element is popped from the stack when emulated reverse execution identifies an instruction that changes application state.

12. The computer system of claim 8, wherein collecting the emulated historical execution state comprises collecting the emulated historical execution state by iteratively emulating execution from the snapshot toward the endpoint, where each iteration of emulated execution emulates execution of progressively smaller portions of the application, such that reverse execution of the application is emulated by surfacing state as a result of each iteration.

13. The computer system of claim 12, wherein each iteration executes one less bytecode instruction than the previous iteration.

14. The computer system of claim 8, wherein one or more computer-readable media further have stored thereon instructions that are executable by the one or more processors to configure the computer system to collect non-deterministic state for the application by executing lower level application code for the application in conjunction with emulating execution of the application.

15. A computer physical readable media having stored thereon instructions that are executable by one or more processors to configure a computer system to perform reverse execution debugging of an application, including instructions that are executable to configure the computer system to perform at least the following:
  identify a snapshot of application state for an application in an application framework;
  emulate execution of the application on a debugger virtual machine that emulates functionality of a runtime virtual machine, using bytecode, to emulate execution of the application on the runtime virtual machine such that at least a portion of the intermediate level code is not converted to native machine instructions and executed on the runtime virtual machine in a forward direction from the snapshot to an end point, causing generation of emulated historical execution state at various points along the emulation of the application;
  collect the emulated historical execution state; and
  use the collected emulated historical execution state, emulating reverse execution of the application by substituting the collected emulated historical execution state, when needed, to restore previous state needed as a result of emulation of reverse execution of the application.

16. The computer readable storage media of claim 15, wherein collecting the emulated historical execution state comprises collecting the emulated historical execution state into a stack such that the previous state can be restored by popping elements of the emulated historical execution state from the stack.

17. The computer readable storage media of claim 16, wherein there is a different stack for each thread being emulated.

18. The computer readable storage media of claim 16, wherein an element is popped from the stack when emulated reverse execution identifies an instruction that changes application state.

19. The computer readable storage media of claim 15, wherein collecting the historical execution state comprises collecting the emulated historical execution state by iteratively emulating execution from the snapshot toward the endpoint, where each iteration of emulated execution emulates execution of progressively smaller portions of the application, such that reverse execution of the application is emulated by surfacing state as a result of each iteration.

20. The computer readable storage media of claim 16, further comprising instructions that are executable by the one or more processors to configure the computer system to collect runtime virtual machine external state for the application by executing lower level application code for the application in conjunction with emulating execution of the application.

* * * * *